(12) United States Patent
Taniguchi et al.

(10) Patent No.: US 7,011,709 B2
(45) Date of Patent: *Mar. 14, 2006

(54) CRYSTALLIZATION APPARATUS, OPTICAL MEMBER FOR USE IN CRYSTALLIZATION APPARATUS, CRYSTALLIZATION METHOD, THIN FILM TRANSISTOR, AND DISPLAY

(75) Inventors: Yukio Taniguchi, Yokohama (JP); Masakiyo Matsumura, Yokohama (JP); Hirotaka Yamaguchi, Yokohama (JP); Mikihiko Nishitani, Yokohama (JP); Susumu Tsujikawa, Yokohama (JP); Yoshinobu Kimura, Yokohama (JP); Masayuki Jyumonji, Yokohama (JP)

(73) Assignee: Advanced LCD Technologies Development Center Co., Ltd., Yokohama (JP)

( * ) Notice: Subject to any disclaimer, the term of this patent is extended or adjusted under 35 U.S.C. 154(b) by 23 days.

This patent is subject to a terminal disclaimer.

(21) Appl. No.: 10/603,771

(22) Filed: Jun. 26, 2003

(65) Prior Publication Data

US 2004/0005744 A1    Jan. 8, 2004

(30) Foreign Application Priority Data

Jun. 28, 2002   (JP)   ............................. 2002-188845

(51) Int. Cl.
   *C30B 29/16*   (2006.01)

(52) U.S. Cl. .................. 117/200; 117/201; 117/202; 117/203; 372/22; 430/5

(58) Field of Classification Search ................ 117/200, 117/201, 202, 203; 372/22; 430/5
See application file for complete search history.

(56) References Cited

U.S. PATENT DOCUMENTS

| | | | |
|---|---|---|---|
| 6,734,635 B1 * | 5/2004 | Kunii et al. | 315/169.3 |
| 6,746,942 B1 | 6/2004 | Sato et al. | |
| 2002/0104750 A1 * | 8/2002 | Ito | 204/157.15 |
| 2003/0099264 A1 * | 5/2003 | Dantus et al. | 372/25 |
| 2003/0231663 A1 * | 12/2003 | Ohtsuki et al. | 372/22 |
| 2004/0005744 A1 | 1/2004 | Taniguchi et al. | |
| 2004/0036969 A1 | 2/2004 | Taniguchi et al. | |

(Continued)

OTHER PUBLICATIONS

W. Yeh, et al., Jpn. J. Appl. Phys., vol. 41, part 1, No. 4A, pp. 1909-1914, "Proposed Sample Structure for Marked Enlargement of Excimer-Laser-Induced Lateral Grain Growth in Si Thin Films", Apr. 2002.

(Continued)

*Primary Examiner*—Robert Kunemund
(74) *Attorney, Agent, or Firm*—Oblon, Spivak, McClelland, Maier & Neustadt, P.C.

(57) ABSTRACT

A crystallization apparatus includes an illumination optical system to illuminate a phase shift mask and which irradiates an amorphous semiconductor film with a light beam having an intensity distribution of an inverse peak type having a smallest light intensity in a point corresponding to a phase shift portion of the phase shift mask to generate a crystallized semiconductor film. A convergence/divergence element is disposed on a light path between the illumination optical system and phase shift mask. The convergence/divergence element converts the light beam supplied from the illumination optical system into a light beam having an upward concave intensity distribution in which the light intensity is lowest in the phase shift portion and in which the light intensity increases as distant from the phase shift portion to irradiate the phase shift mask.

16 Claims, 9 Drawing Sheets

U.S. PATENT DOCUMENTS

| | | | |
|---|---|---|---|
| 2004/0061149 A1* | 4/2004 | Jyumonji et al. | 257/268 |
| 2004/0126674 A1* | 7/2004 | Taniguchi et al. | 430/5 |
| 2004/0142544 A1* | 7/2004 | Kimura et al. | 438/486 |
| 2004/0161913 A1* | 8/2004 | Kawasaki et al. | 438/487 |
| 2004/0266080 A1* | 12/2004 | Jyumonji et al. | 438/166 |

OTHER PUBLICATIONS

M. Nakata, et al., Jpn. J. Appl. Phys., vol. 40, part 1, No. 5A, pp. 3049-3054, "A New Nucleation-Sit-Control Excimer-Laser-Crystallization Method", May 2001.

C.- H. Oh, et al., Jpn. J. Appl. Phys., vol. 37, part 2, No. 5A, pp. L492-L495, "A Novel Phase-Modulated Excimer-Laser Crystallization Method of Silicon Thin Films", May 1998.

M. Matsumura, et al., Thin Solid Films 337, pp. 123-128, "Advnced Excimer-Laser Annealing Process for Quasi Single-Crystal Silicon Thin-Film Devices", 1999.

M. Matsumura, Applied Physics, vol. 71, No. 5, pp. 543-547, "Excimer-Laser-Grown Silicon Thin Films With Ultralarge Grains", 2002.

Masakiyo Matsumura, "Preparation of Ultra-Large Grain Silicon Thin-Films by Excimer-Laser", Surface Science, vol. 21, No. 5, pp. 278-287, 2000.

2000-306859, published Nov. 2, 2000.

M. Nakata, et al., "Two-Dimensionally Position-Controlled Ultra-Large Grain Growth Based on Phase-Modulated Excimer-Laser Annealing Method", Department of Physical Electronics, Tokyo Institute of Technology, Electrochemical Society Proceedings, vol. 2000-31, pp. 148-154.

Wen-Chang Yeh, et al., "Effects of a Low-Melting-Point Underlayer on Excimer-Laser-Induced Lateral Crystallization of Si Thin-Films", Jpn. J. Appl. Phys. vol. 40 (2001), Part 1,No. 5A, May 2001, pp. 3096-3100.

Y. Sano, et al., "Highly Packed and Ultra-Large Si Grains Grown by a Single-Shot Irradiation of Excimer-Laser Light Pulse", Department of Physical Electronics, Tokyo Institute of Technology, (8 pages).

* cited by examiner

CRYSTALLIZATION APPARATUS, OPTICAL MEMBER FOR USE IN CRYSTALLIZATION APPARATUS, CRYSTALLIZATION METHOD, THIN FILM TRANSISTOR, AND DISPLAY

CROSS-REFERENCE TO RELATED APPLICATIONS

This application is based upon and claims the benefit of priority from the prior Japanese Patent Application No. 2002-188845, filed Jun. 28, 2002, the entire contents of which are incorporated herein by reference.

BACKGROUND OF THE INVENTION

1. Field of the Invention

The present invention relates to a crystallization apparatus in which semiconductor film is irradiated a non-crystallized with a laser beam to form a crystallized semiconductor film, an optical member for use in the crystallization apparatus, and a crystallization method. The present invention particularly relates to a crystallization apparatus in which a non-crystallized semiconductor film is irradiated with a laser beam phase-modulated using an optical modulating member such as a phase shift mask or plate to form a crystallized semiconductor film, and a crystallization method.

2. Description of the Related Art

For example, a semiconductor material of a thin film transistor (TFT) for use in a switching element which controls voltage applied to a pixel of a liquid crystal display (LCD) has heretofore been roughly classified into an amorphous semiconductor such as a-silicon and poly-semiconductor such as poly-silicon.

Poly-silicon has a higher electron mobility than that of amorphous silicon. Therefore, when poly-silicon is used to form the transistor, a switching speed is faster than that with the use of amorphous silicon. Therefore, response of the display is accelerated, and there is an advantage that a design margin of another component can be reduced. With the use of poly-silicon, when not only a display main body but also peripheral circuits such as a driver circuit and DAC are incorporated in the display, these peripheral circuits can be operated at a higher rate.

Poly-silicon is constituted of a grope of crystal grains, but is lower in electron mobility than single crystal silicon. In a small-sized transistor formed using poly-silicon, a dispersion of the number of crystal grain boundaries in a channel portion is a problem. To solve the problem, in recent years, there has been proposed a crystallization method of generating poly-silicon having a large grain size in order to enhance the electron mobility and to reduce the dispersion of the number of crystal grain boundaries in the channel portion.

As this type of crystallization method, "phase control excimer laser annealing (ELA)" has heretofore been known in which a polycrystalline semiconductor film or an amorphous semiconductor film is irradiated with an excimer laser beam via a phase shift mask to generate a crystallized semiconductor film. Details of the phase control ELA are disclosed in "Surface Science Vol. 21, No. 5, pp. 278 to 287, 2000".

In the phase control ELA, an intensity distribution of an inverse peak type (intensity distribution in which light intensity rapidly rises as distant from a position where the light intensity is minimum) is generated by the phase shift mask. The polycrystalline semiconductor film or the amorphous semiconductor film is irradiated with a light beam which periodically has this inverse peak type intensity distribution. As a result, a molten region is generated in accordance with the light intensity distribution, and a crystal nucleus is formed in a non-molten portion or a first coagulated portion disposed opposite to a position where the light intensity is minimized. When a crystal grows in a lateral direction toward periphery from the crystal nucleus (lateral growth), the crystal having a large grain size is generated.

As described above, in the related art, the semiconductor film is irradiated with the light beam which has the light intensity distribution of the inverse peak type, the crystal nucleus is formed in the portion disposed opposite to the position where the light intensity is minimized in the intensity distribution, and therefore the control of the formed position of the crystal nucleus is possible. However, it is impossible to control the intensity distribution in an intermediate portion between two inverse peak portions display adjacent to each other.

In actual, in the related art, the intensity distribution in the intermediate portion generally involves an irregular surge (undulated distribution in which increase and decrease of the light intensity are repeated). In this case, in a process of crystallization, the lateral growth started from the crystal nucleus toward the periphery stops in a portion in which the light intensity decreases in the intermediate portion, and there is a disadvantage that a large crystal is inhibited from growing. Even if a substantially homogeneous intensity distribution is obtained in the intermediate portion, the lateral growth stops in an arbitrary position of this homogeneous intensity distribution, and there is a disadvantage that the growth of the large crystal is inhibited.

BRIEF SUMMARY OF THE INVENTION

The present invention has been developed in consideration of the above-described problem, and an object thereof is to provide a crystallization apparatus and crystallization method in which sufficient lateral growth from a crystal nucleus is realized and a crystallized semiconductor film having a large grain size can be generated.

To solve the problem, according to a first aspect of the present invention, there is provided a crystallization apparatus comprising: an illumination optical system to emit a light beam having a homogeneous intensity distribution to a non-crystallized semiconductor film, so that the non-crystallized semiconductor film is irradiated with the light beam to crystallize the non-crystallized semiconductor film, the crystallization apparatus further comprising: an optical conversion element which converts the light beam having the homogeneous intensity distribution to a light beam having a periodical upward concave intensity distribution; and a phase shift mask which gives a phase difference of $\pi$ between transmitted partial light beams and which converts the light beam having the homogeneous intensity distribution into a light beam having a periodical intensity distribution of an inverse peak type and which comprises a phase shift portion to determine a position where the intensity distribution of the inverse peak type is minimized. The optical conversion element is positioned on a light path between the illumination optical system and non-crystallized semiconductor film, and the phase shift mask is positioned on the light path between the optical conversion element and non-crystallized semiconductor film. The optical conversion element and phase shift mask are positioned so that a minimum position of the upward concave intensity distribution is disposed opposite to the phase shift portion. The light beam which is converted by the optical conversion element and phase shift mask and with which the non-crystallized semiconductor film is irradiated has the intensity distribution including an inverse peak portion inside an upward concave portion.

According to a preferred mode of the first aspect, the non-crystallized semiconductor film may be disposed substantially in parallel with and in the vicinity of the phase shift mask. The crystallization apparatus may further comprises: an optical image forming system positioned on the light path between the phase shift mask and non-crystallized semiconductor film, and the non-crystallized semiconductor film may be distant from a surface optically conjugated with the phase shift mask along an optical axis of the optical image forming system. Alternatively, an image-side numerical aperture of the optical image forming system may be set so as to convert the light beam from the phase shift mask to the light beam which has the periodical intensity distribution of the inverse peak type.

Moreover, according to the preferred mode of the first aspect, the optical conversion element may be a convergence/divergence element including a divergence region by which the light beam from the illumination optical system diverges and a convergence region by which the light beam from the illumination optical system converges to lower a light intensity of the phase shift portion by a divergence function and convergence function. In this case, the divergence region preferably includes a divergence refractive surface by which the light beam diverges by a refraction function, and the convergence region preferably includes a convergence refractive surface by which the light beam converges by the refraction function. In this case, the divergence refractive surface and convergence refractive surface preferably include a one-dimensional refraction function along a predetermined direction or a two-dimensional refraction function toward two directions crossing at right angles to each other.

According to a second aspect of the present invention, there is provided an optical member comprising: a first optical conversion portion which converts an incident light beam having a homogeneous intensity distribution into a light beam having an upward concave intensity distribution; and a second optical conversion portion which converts the light beam having the upward concave intensity distribution into a light beam having an intensity distribution including an inverse peak portion inside an upward concave portion.

According to a third aspect of the present invention, there is provided a crystallization method comprising: converting a light beam having a homogeneous intensity distribution into a light beam having a periodical upward concave intensity distribution; further converting the light beam into a light beam having an intensity distribution including an inverse peak portion inside an upward concave portion; and irradiating and crystallizing the non-crystallized semiconductor film with the finally converted light beam.

Moreover, there is provided a crystallization method in which a phase shift mask is illuminated and a non-crystallized semiconductor film is irradiated with a light beam having an intensity distribution of an inverse peak type having a minimum light intensity in a point of the phase shift mask disposed opposite to a phase shift portion to generate a crystallized semiconductor film, the crystallization method comprising: irradiating the phase shift mask with a light having an upward concave intensity distribution in which a light intensity is lowest in the phase shift portion or in the vicinity of the phase shift portion and in which the light intensity increases as distant from the phase shift portion.

DETAILED DESCRIPTION OF THE INVENTION

Embodiments of the present invention will be described with reference to the accompanying drawings.

Figure 1:
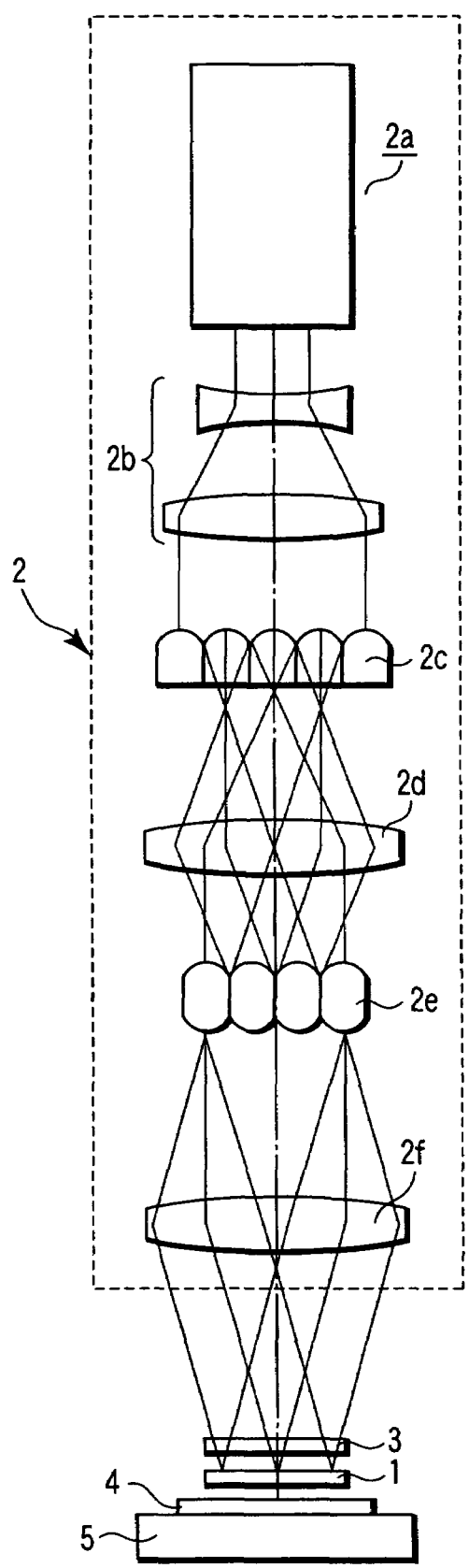
FIG. 1 is a diagram schematically showing a crystallization apparatus according to a first embodiment of the present invention.

FIG. 1 is a diagram schematically showing a constitution of a crystallization apparatus according to a first embodiment of the present invention. As shown in FIG. 1, the crystallization apparatus of the first embodiment includes: an illumination optical system 2 which illuminates a substrate 4 and which emits a light beam having a light intensity to melt a film to be treated of the substrate 4; a convergence/divergence element 3 which is an optical conversion element disposed on a light path between the substrate 4 and illumination optical system 2; and a phase shifter, that is, a phase shift mask 1 disposed on the light path between the convergence/divergence element 3 and substrate 4.

The substrate 4 is disposed in parallel with and in the vicinity of the phase shift mask 1 (e.g., at an interval of several micrometers to several hundreds of micrometers). The substrate 4 includes a non-crystallized semiconductor film such as a polycrystalline semiconductor film or an amorphous semiconductor film, and is obtained by forming an amorphous silicon film, for example, on an underlayer film on a glass plate for a liquid crystal display, by a chemical vapor phase growth process. In the first embodiment, the phase shift mask 1 is disposed opposite to the amorphous semiconductor film. The substrate 4 is held in a predetermined position on a substrate stage 5 by a vacuum or electrostatic chuck.

The illumination optical system 2 includes a KrF excimer laser beam source 2a for supplying a layer beam which has a wavelength, for example, of 248 nm, and a wavefront dividing element. The wavefront dividing element includes a beam expander 2b for expanding the laser beam from the light source 2a, first and second fly eye lenses 2c, 2e constituted of a plurality of convex lenses, and first and second condenser optical systems 2d, 2f. It is to be noted that another appropriate beam source such as such as an XeCl excimer laser beam source can also be used as the light source 2a. For the wavelength of the laser beam emitted from the light source 2a, a wavelength having a high absorption factor in the film to be treated is selected. When the film to be treated is made of amorphous silicon, an ultraviolet band wavelength of 248 nm is preferable.

As schematically shown in FIG. 1, the light beam emitted from the light source 2a is expanded via the beam expander 2b, and is incident upon the first fly eye lens 2c. Since the light beam incident upon the first fly eye lens 2c undergoes convergence functions by convex lenses of the first fly eye lens 2c, a plurality of point light sources are substantially formed in a focal plane on the back side of the first fly eye lens 2c. The light beams from the plurality of point light sources illuminate the incidence surface of the second fly eye lens 2e via the first condenser optical system 2d in a superimposing manner.

Since the light beams incident upon the second fly eye lens 2e from the plurality of point light sources undergo the convergence functions by the convex lenses of the second fly eye lens 2e, a plurality of point light sources more than those in the focal plane on the back side of the first fly eye lens 2c are formed in the back-side focal plane of the second fly eye lens 2e. The light beams from the plurality of point light sources formed in the back-side focal plane of the second fly eye lens 2e are further incident upon the second condenser optical system 2f.

The first fly eye lens 2c and first condenser optical system 2d constitute a first homogenizer, and homogenize an incidence angle on the phase shift mask 1. Similarly, the second fly eye lens 2e and second condenser optical system 2f constitute a second homogenizer, and homogenize an in-plane position on the phase shift mask 1. Therefore, the illumination optical system 2 emits the light beam which has the substantially homogeneous intensity distribution in a superimposing manner.

Figure 2A:
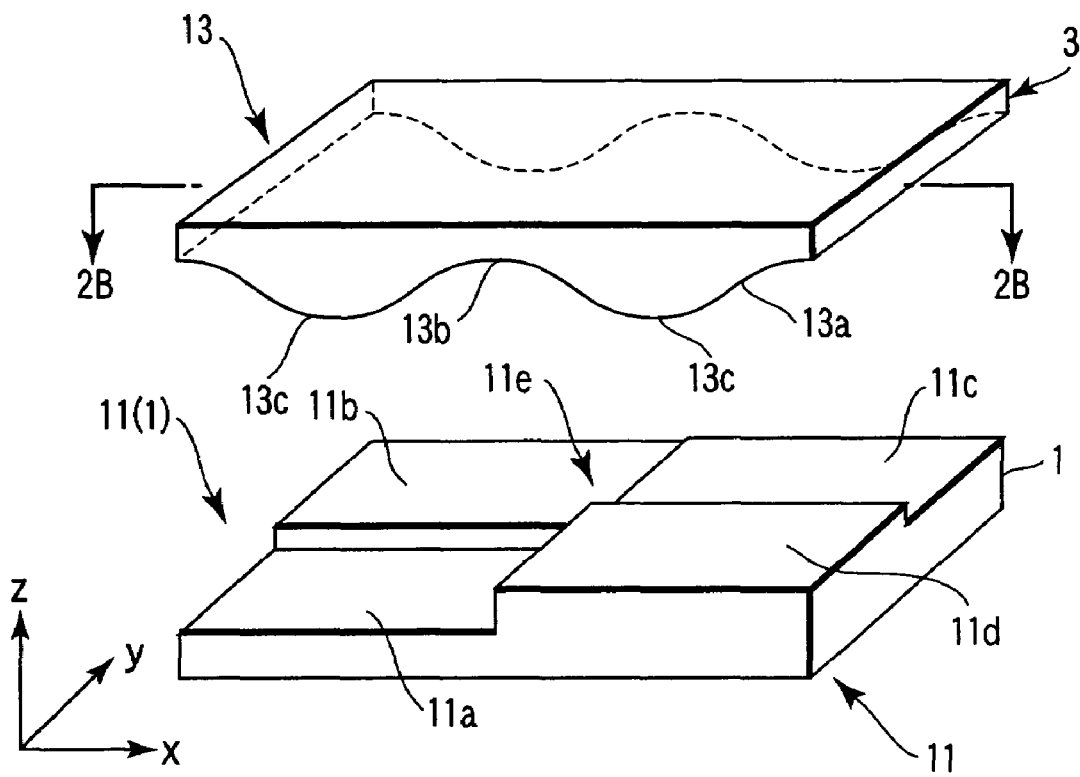
FIG. 2A is a perspective view showing basic unit portions of a phase shift mask and convergence/divergence element.
Figure 2B:
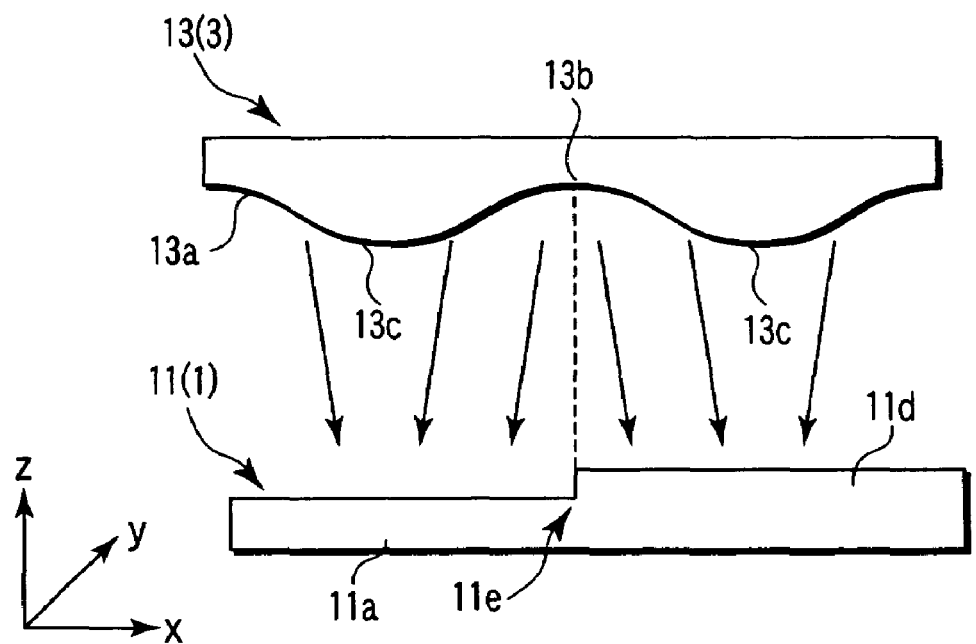
FIG. 2B is a sectional view along line 2B—2B of FIG. 2A.

FIG. 2A is a perspective view schematically showing basic unit portions of the phase shift mask and convergence/divergence element, and FIG. 2B is a sectional view along line 2B—2B of FIG. 2A.

As shown in FIG. 2A, a basic unit portion 13 of the convergence/divergence element 3 includes two convex portions projecting on a phase shift mask 1 side, and a concave portion positioned between the convex portions, and these convex and concave portions entirely form a continuous refractive surface 13a which has a substantially sinusoidal waveform. Each of the convex portions forms a convergence refractive surface 13c for collecting the light beams incident upon the convergence/divergence element 3, and the concave portion forms a divergence refractive surface 13b which allows the light beam to diverge. By the convergence refractive surfaces 13c and divergence refractive surface 13b, the basic unit portion 13 of the convergence/divergence element 3 has a one-dimensional refraction function along an x-direction as shown in FIG. 2B. The light transmitted through the divergence refractive surface 13b of the concave portion is a divergent light, and is incident upon a phase shift portion lie of the phase shift mask 1. The light transmitted through the convergence refractive surface 13c of the convex portion forms a convergent light, and is incident upon four rectangular regions 11a to 11d of the phase shift mask 1.

The basic unit portion 11 of the phase shift mask 1 has substantially the same size as that of the basic unit portion 13 of the convergence/divergence element 3 in an x-y plane, and is disposed in parallel with and in the vicinity of the basic unit portion 13 in a z-direction. The basic unit portion 11 of the phase shift mask 1 includes rectangular first to fourth regions, that is, first to fourth phase shift surfaces 11a to 11d. The first and third regions 11a and 11c, and the second and fourth regions 11b and 11d are diagonally positioned. Each of two diagonally positioned pairs of regions 11a, 11c; 11b, 11d gives a phase difference of π between the transmitted light beams. That is, for the phase shift mask 1, the first to fourth regions 11a to 11d mutually have stepped shapes. The steps of the regions 11a to 11d may also be formed, for example, by etching flat quartz glass plate, or by forming films of different thickness on flat quartz glass by a deposition method such as CVD or sputtering.

Concretely, for example, when the phase shift mask 1 is formed of quartz glass having a refractive index of 1.5 with respect to the light beam having a wavelength of 248 nm, a step of 124 nm is given between the first and second regions 11a and 11b, a step of 248 nm is given between the first and third regions 11a and 11c, and a step of 372 nm is given between the first and fourth regions 11a and 11d. The vicinity of an intersection of four phase shift lines which are boundary lines of the respective regions 11a to 11d forms the phase shift portion 11e. The step of the diagonally positioned regions is formed to indicate a phase difference of 180 degrees.

For the sinusoidal wave shaped refractive surface 13a of the convergence/divergence element 3, the center of the divergence refractive surface 13b is disposed opposite to the phase shift portion 11e of the basic unit portion 11 of the phase shift mask 1. A middle line of the convergence refractive surface 13c (i.e., most projecting center line) is disposed opposite to center lines of the first to fourth regions, which extend in y-directions. In this manner, the convergence/divergence element 3 and phase shift mask 1 are positioned.

Figures 3, 4:
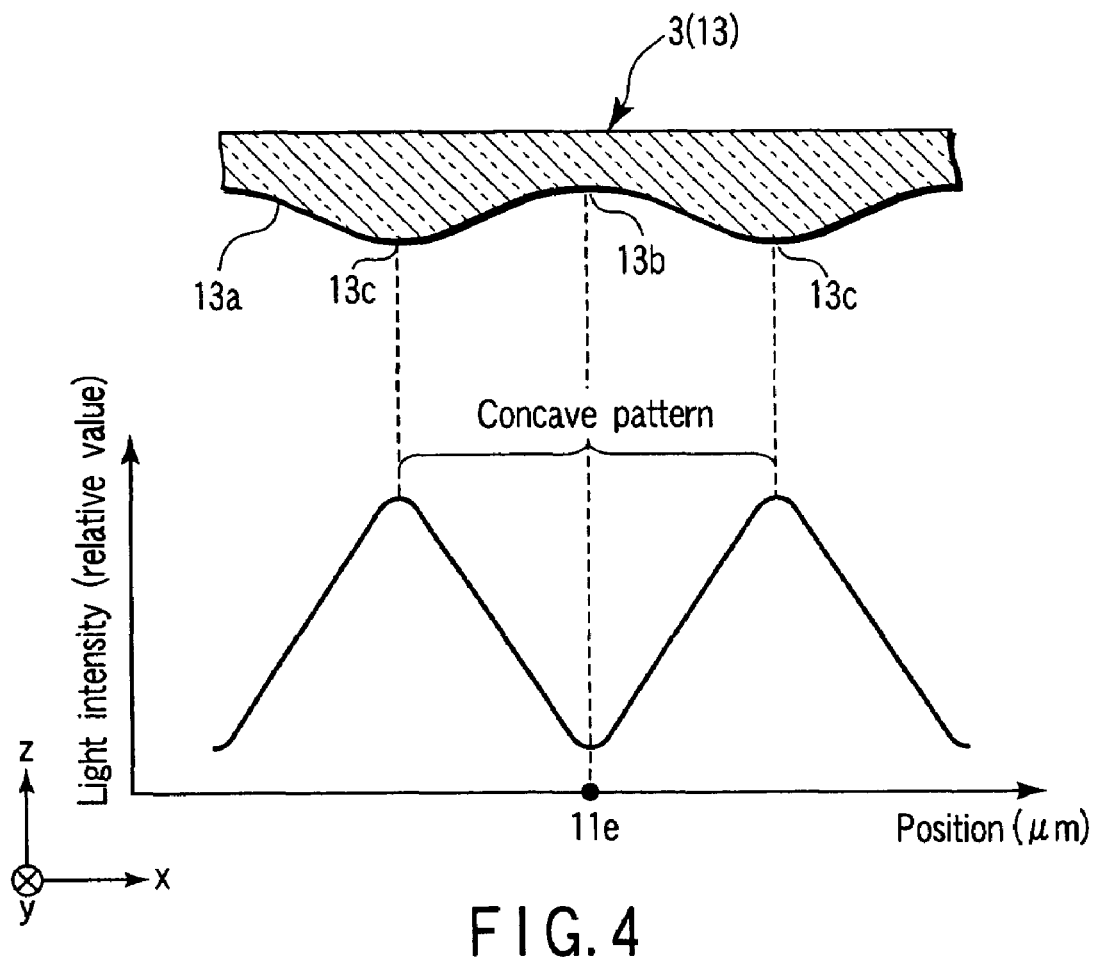
FIG. 3 is a top plan view showing arrangement of the basic unit portions of the phase shift mask.
FIG. 4 is an explanatory view showing a function of the convergence/divergence element.

For example, as shown in FIG. 3, the phase shift mask 1 is constituted by arranging a plurality of, for example, four basic unit portions 11 (FIG. 2A) two-dimensionally, that is, in a 2×2 matrix form. The convergence/divergence element 3 is constituted by two-dimensionally arranging the basic unit portions 13 with respect to the basic unit portion 11 of the phase shift mask 1.

The phase shift mask 1 according to the first embodiment includes the four basic unit portions 11, each having four square regions, but may also include, for example, a plurality of basic unit regions, each having two elongate regions which give a phase difference of π to the transmitted light beam. When the phase shift mask 1 includes a plurality of regions of two types, the different-type regions are alternately and one-dimensionally arranged along one axis, and the phase shift portion is positioned in the boundary of the different-type regions.

The light beam which is emitted from the illumination optical system 2 and which has a substantially homogeneous intensity distribution is transmitted through the convergence/divergence element 3 and then incident upon the phase shift mask 1. For parts of the light beam which are incident upon the basic unit portion 13 of the convergence/divergence element 3 and which have the homogeneous intensity distribution, the parts of the light beam transmitted through the divergence refractive surface 13b undergo a divergence function and are incident upon the region centering on the phase shift portion 11e. Parts of the light beam transmitted through the convergence refractive surface 13c undergo a convergence function and are incident upon opposite sides of the phase shift portion 11e along the x-direction.

FIG. 4 is an explanatory view illustrating an optical function of the convergence/divergence element 3. The convergence/divergence element 3 is shown in a section on the upper side of FIG. 4, and a light intensity distribution of the transmitted light is shown on the lower side of FIG. 4. As shown in FIG. 4, the light beam transmitted through the convergence/divergence element 3 including a plurality of basic unit portions 13 has a minimum light intensity area corresponding to each phase shift portion 1ie of the phase shift mask 1, has a linearly increasing light intensity area as distant from the minimum light intensity area, and further has periodical concave intensity distribution area. Concretely, in the upward concave intensity distribution, the light intensity is minimum in a position corresponding to the center of the divergence refractive surface 13b, and the light intensity is maximum in a position corresponding to the center of the convergence refractive surface 13c.

It is to be noted that the upward concave intensity distribution has a curve profile in an x-z plane as shown in FIG. 4, but the profile in a y-z plane is uniform. A width of an upward concave portion is preferably set to be equal to a pixel pitch of a liquid crystal.

The substrate 4 disposed in parallel with and in the vicinity of the phase shift mask 1 is irradiated with the light beam phase-modulated by the phase shift mask 1. A phase difference of $\pi/2$ is given between parts of the light beam transmitted through the first region 11a and the second region 11b. Similarly, the phase difference of $\pi/2$ is also given between parts of the light beam transmitted through the second region 11b and the third region 11c, between parts of the light beam transmitted through the third region 11c and the fourth region 11d, and between parts of the light beam transmitted through the fourth region 11d and the first region 11a, respectively.

Figure 5:
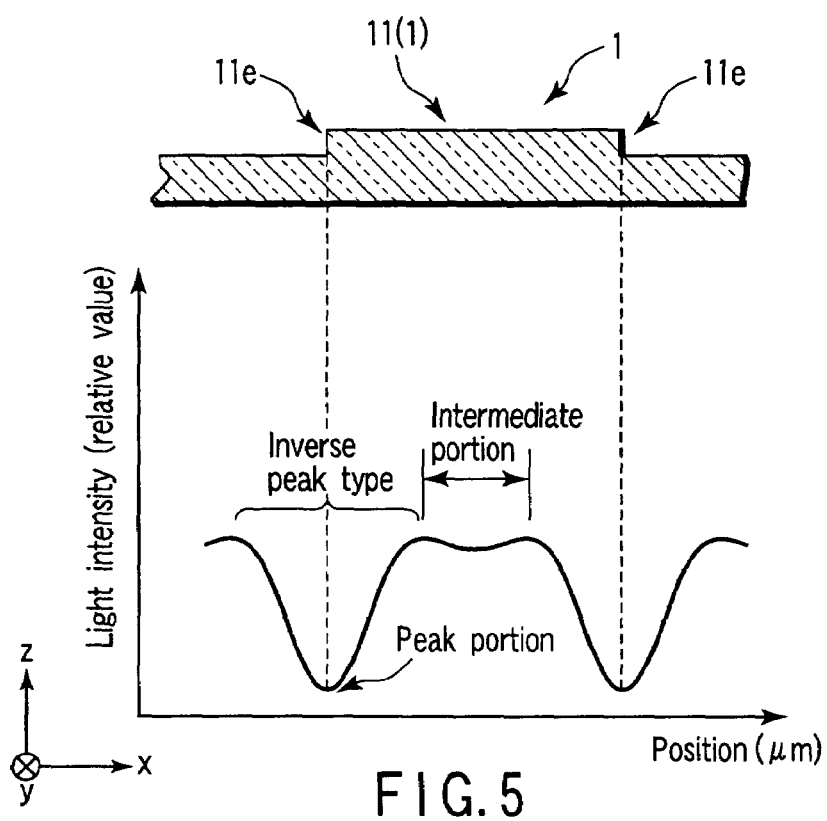
FIG. 5 is an explanatory view of the function of the phase shift mask.

FIG. 5 is an explanatory view illustrating a function of the phase shift mask 1. A part of the phase shift mask 1 is shown in the section on the upper side of FIG. 5, and the light intensity distribution of the transmitted light is shown on the lower side of FIG. 5. The convergence/divergence element 3 which is the optical conversion element is removed from the light path between the illumination optical system 2 and phase shift mask 1, that is, a substantially homogeneous light beam is directly incident onto the phase shift mask 1. The basic operation of the phase shift mask 1 in this case will be described hereinafter.

Since the phase shift mask 1 is set so as to obtain a phase difference of $\pi/2$ between two regions disposed adjacent to each other, the light intensity decreases but does not turn to 0 in a position corresponding to the phase shift line. On the other hand, since an integral value of a complex transmittance of a circular region centering on an intersection of the phase shift lines is set to 0, the light intensity is attenuated substantially to 0 in this intersection, that is, in a position corresponding to the phase shift portion 11e.

Therefore, for the light beam transmitted through phase shift mask 1 including a plurality of basic unit portions 11, as shown in FIG. 5, the light intensity is substantially 0 in a point corresponding to each phase shift portion 11e of the phase shift mask 1 on the substrate 4, and the light intensity rapidly increases as distant from the point corresponding to the phase shift portion 11e. The beam periodically has such light intensity distribution of an inverse peak type. That is, a minimum position of this periodical intensity distribution of the inverse peak type is determined by the phase shift portion 11e. It is to be noted that the periodical light intensity distribution of the inverse peak type has substantially the same profile both in the x-z plane and y-z plane. The width of an inverse peak portion changes in proportion to the power of ½ of a distance between the phase shift mask 1 and substrate 4 (i.e., the defocus amount).

As described above, when the semiconductor film is irradiated with the light beam periodically having only the light intensity distribution of the inverse peak type shown in FIG. 5, lateral growth started toward the periphery from a crystal nucleus generated by a peak portion stops in an intermediate portion between inverse peak portions. In the first embodiment, in order to realize sufficient lateral growth from the crystal nucleus corresponding to the peak portion, the convergence/divergence element 3 shown in FIGS. 2A, 2B, and 4 is disposed on the light path between the illumination optical system 2 and phase shift mask 1.

Figure 6A:
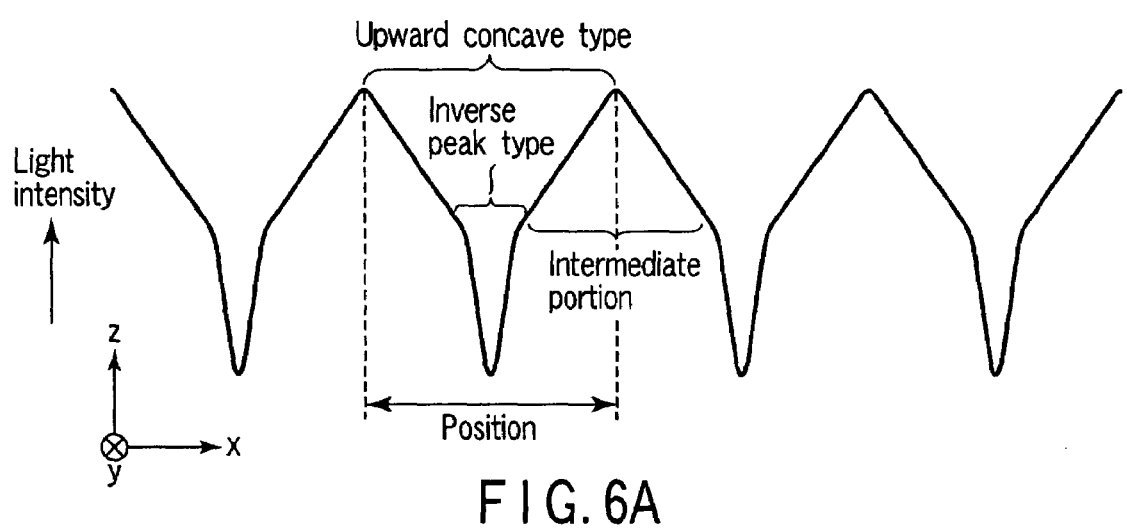
FIG. 6A is a diagram showing an intensity distribution in an x-z plane of a light beam transmitted through both the convergence/divergence element and phase shift mask.
Figure 6B:
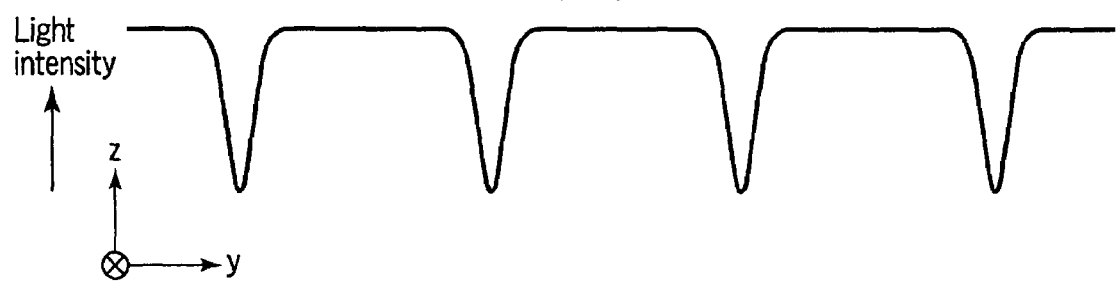
FIG. 6B is a diagram showing an intensity distribution in a y-z plane of the light beam transmitted through both the convergence/divergence element and phase shift mask.

FIG. 6A is a diagram showing a light intensity distribution in the x-z plane of the light beam transmitted through the phase shift mask 1 and convergence/divergence element 3, on the substrate 4, and FIG. 6B is a diagram showing the light intensity distribution in the y-z plane. As described above, the convergence/divergence element 3 has a function of converting the light beam which is incident from the illumination optical system 2 and which has a homogeneous intensity distribution into the light beam periodically having the upward concave intensity distribution shown in FIG. 4 in which the light intensity is minimum in the phase shift portion 11e and the light intensity increases as distant from the phase shift portion 11e. On the other hand, the phase shift mask 1 has a function of converting the light beam having the homogeneous light intensity distribution into the light beam periodically having the light intensity distribution of the inverse peak type shown in FIG. 5.

Figure 7:
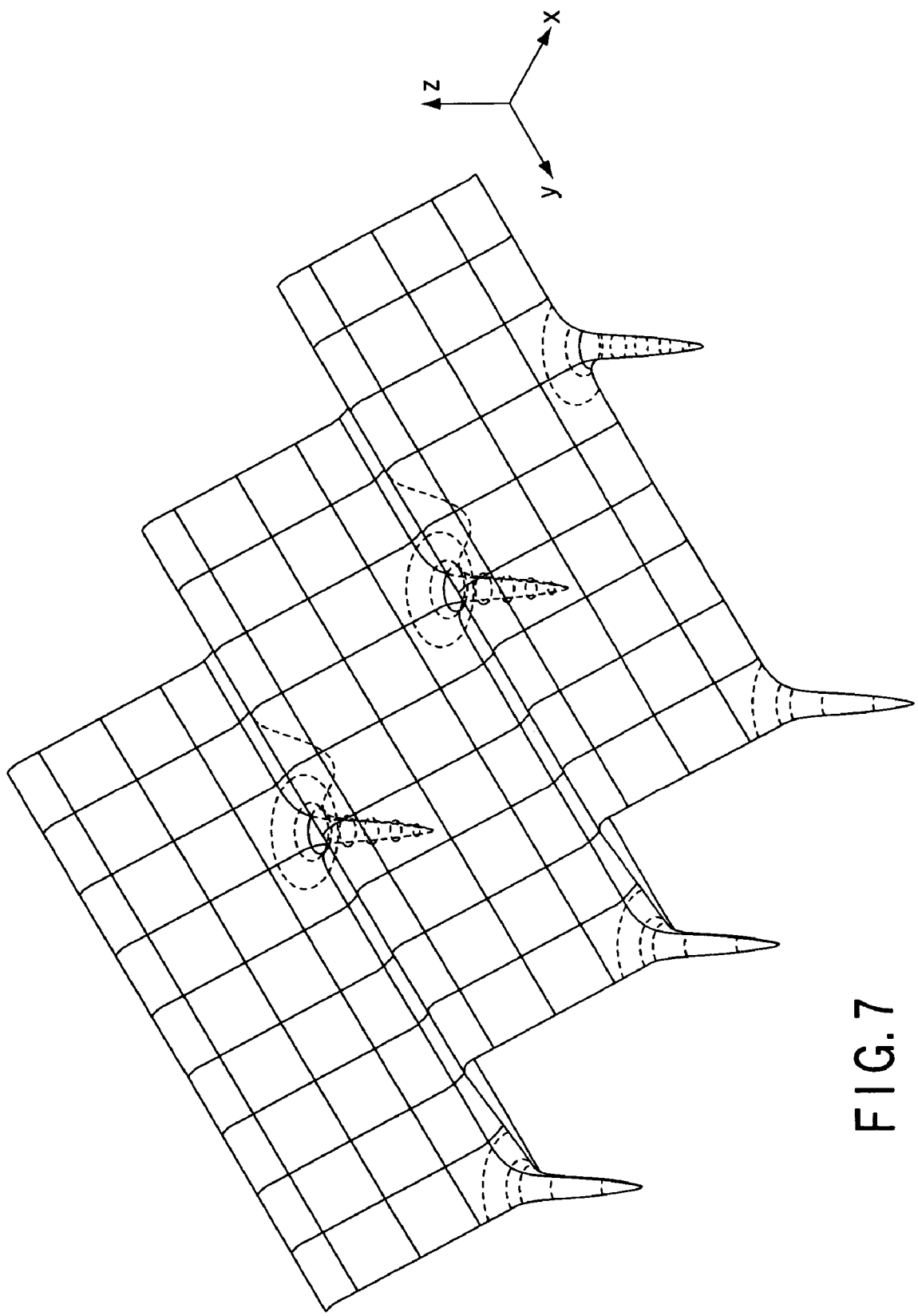
FIG. 7 is a diagram three-dimensionally showing the intensity distributions shown in FIGS. 6A and 6B.

For the crystallization apparatus according to the first embodiment, since the convergence/divergence element 3 is disposed on an incidence light side of the phase shift mask 1, the light beam incident upon the substrate 4 obtains the light intensity distribution which has undergone both functions of the phase shift mask 1 and convergence/divergence element 3. That is, the light beam incident upon the surface of the substrate 4 has a light intensity distribution as shown in FIG. 7 in which the light intensity distribution transmitted through the phase shift mask 1 and shown in FIG. 5 is superimposed on the light intensity distribution transmitted through the convergence/divergence element and shown in FIG. 4. Therefore, the light beam with which the semiconductor film of the substrate 4 is irradiated periodically has a light intensity distribution of a two-steps inverse peak type represented by a product of the intensity distribution of the inverse peak type and the upward concave type light intensity distribution distributed at the same period as shown in FIG. 6A. In this periodical light intensity distribution of the two-steps inverse peak type, for the above-described intensity distribution of the inverse peak type, the light intensity is substantially 0 in the point corresponding to the phase shift portion 11e. As distant from this point, the light intensity increases in a rapid parabolic form to reach a predetermined value. That is, the minimum position of this periodical intensity distribution of the two-steps inverse peak type is determined by that of the phase shift portion 11e. In other words, for the light intensity distribution of the two-steps inverse peak type shown in FIG. 6A, the light intensity distribution of the inverse peak type of the second step shown in FIG. 4 is superimposed upon the intermediate portion of the light intensity distribution of the inverse peak type of the first step shown in FIG. 5. As a result, an influence by surge of the intermediate portion is ignored.

In the first embodiment, the periodical intensity distribution of the two-steps inverse peak type corresponds to the periodical upward concave portion of the x-z direction and the upward concave portion of the y-z direction. As shown in FIG. 7, the intermediate portion between the inverse peak portions disposed adjacent to each other is uniform in the y-direction, and the intensity linearly increases substantially monotonously along the x-direction or substantially linearly increases in a little curved manner. The intensity distribution of the two-steps inverse peak type has an inflection point at which inclination is reduced between the inverse peak portion and the upward concave portion.

When the substrate 4 is irradiated with the light beam including the intensity distribution of the two-steps inverse peak type, the crystal nucleus is formed in a portion corresponding to a point of the minimum light intensity, that is, a point of substantially zero (point corresponding to the phase shift portion 11e). This will be described in detail. The crystal nucleus is generated in a position which has a large inclination in the intensity distribution of the inverse peak type. A polycrystal is generated in the center portion of the inverse peak portion, thereafter outer crystals form the nucleus, and the crystal grows. The position where the crystal grows is in general the position which has a large inclination.

Next, the lateral growth is started along the x-direction which has a large light intensity gradient (i.e., temperature gradient) from the crystal nucleus. Since the portion of the light intensity decrease does not substantially exist in the intermediate portion in the intensity distribution of the two-steps inverse peak type, the lateral growth reaches the peak without stopping halfway from the crystal nucleus, and the large crystal grain can be grown. Particularly in the first embodiment, the inflection point at which the inclination is reduced exists between the inverse peak portion and the upward concave portion. Therefore, when the semiconductor film of the substrate 4 is irradiated with the light beam having the intensity distribution of the two-steps inverse peak type, the crystal grain is grown in a broad region over the width from the center portion of the intensity distribution of the two-steps inverse peak type. When the width of the intensity distribution of the two-steps inverse peak type is set to be equal to the pixel pitch of the liquid crystal, a single crystal can be generated with respect to each pixel. That is, since the surge in the intermediate portion shown in FIG. 5 is eliminated, the lateral growth does not stop.

As described above, in the first embodiment, the sufficient lateral growth from the crystal nucleus is realized, and the crystallized semiconductor film having a large crystal grain size can be generated. Since the crystal generated by the crystallization apparatus according to the first embodiment has the large crystal grain size, the crystal has a high electron mobility in the direction of the lateral growth (x-direction). Therefore, when source and drain regions of a transistor are disposed in the direction of the lateral growth, the transistor having a satisfactory characteristic can be manufactured.

Figure 8:
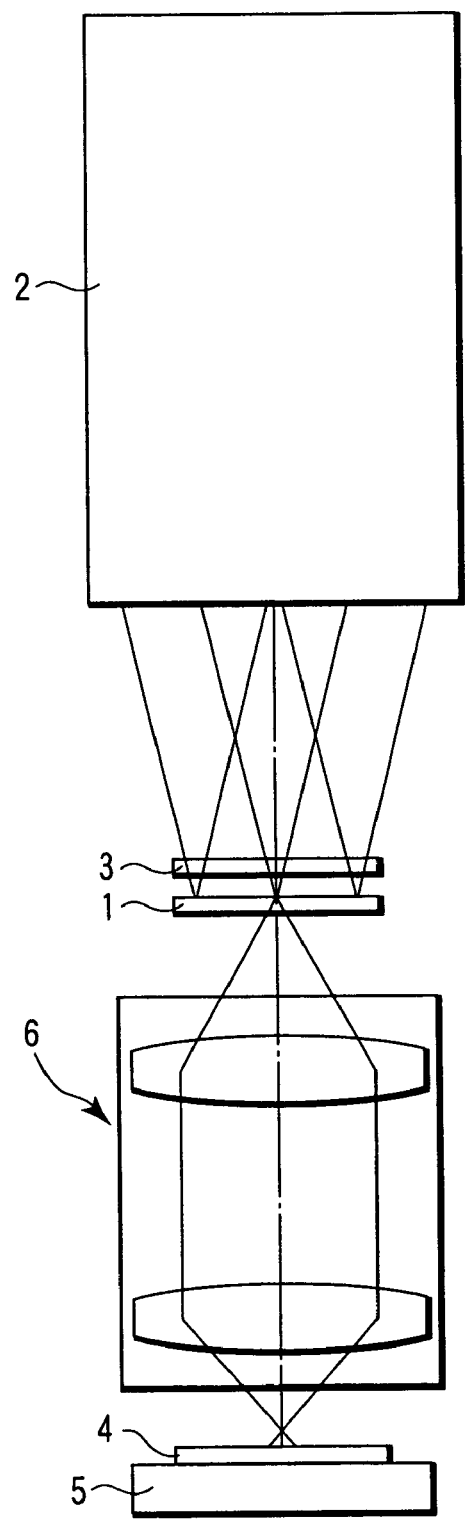
FIG. 8 is a diagram schematically showing the crystallization apparatus according to a second embodiment of the present invention.

FIG. 8 is a diagram schematically showing the constitution of the crystallization apparatus according to a second embodiment of the present invention. The second embodiment has a constitution similar to that of the first embodiment, but is different from the first embodiment in that an optical image forming system 6 is disposed on the light path between the phase shift mask 1 and substrate 4. The different respect from the first embodiment will be noticed, and the second embodiment will be described hereinafter. It is to be noted that in FIG. 8, for clarification of the figure, an inner constitution of the illumination optical system 2 is omitted.

In the second embodiment, as shown in FIG. 8, the substrate 4 is distant from a plane optically conjugated with the phase shift mask 1 (image plane of the optical image forming system 6) on the optical axis. In this case, the width of the intensity distribution of the inverse peak type formed on the semiconductor film of the substrate 4 by the function of the phase shift mask 1 changes substantially in proportion to ½ power of the distance between the image plane of the optical image forming system 6 and the substrate 4 (i.e., the defocus amount), assuming that a resolution of the optical image forming system 6 is sufficient. It is to be noted that the optical image forming system 6 may be any one of a refractive optical system, reflective optical system, and refractive/reflective optical system.

In the second embodiment, in the same manner as in the first embodiment, the semiconductor film of the substrate 4 is irradiated with the light beam which has the intensity distribution of the two-steps inverse peak type by both functions of the convergence/divergence element 3 and phase shift mask 1. Therefore, the lateral growth reaches the peak without stopping halfway from the crystal nucleus, and the crystallized semiconductor film having the large grain size can be generated.

Moreover, in the second embodiment, since the optical image forming system 6 is disposed on the light path between the phase shift mask 1 and substrate 4, and a relatively large interval between the substrate 4 and optical image forming system 6 is secured, the phase shift mask 1 is prevented from being contaminated by abrasion of the substrate 4. Therefore, satisfactory crystallization can be realized without being influenced by the abrasion in the substrate 4.

Further in the second embodiment, since the relatively large interval between the substrate 4 and optical image forming system 6 is secured, a detection light for position detection is introduced onto the light path between the substrate 4 and optical image forming system 6, and it is thus easy to adjust a positional relation between the substrate 4 and optical image forming system 6.

Figure 9:
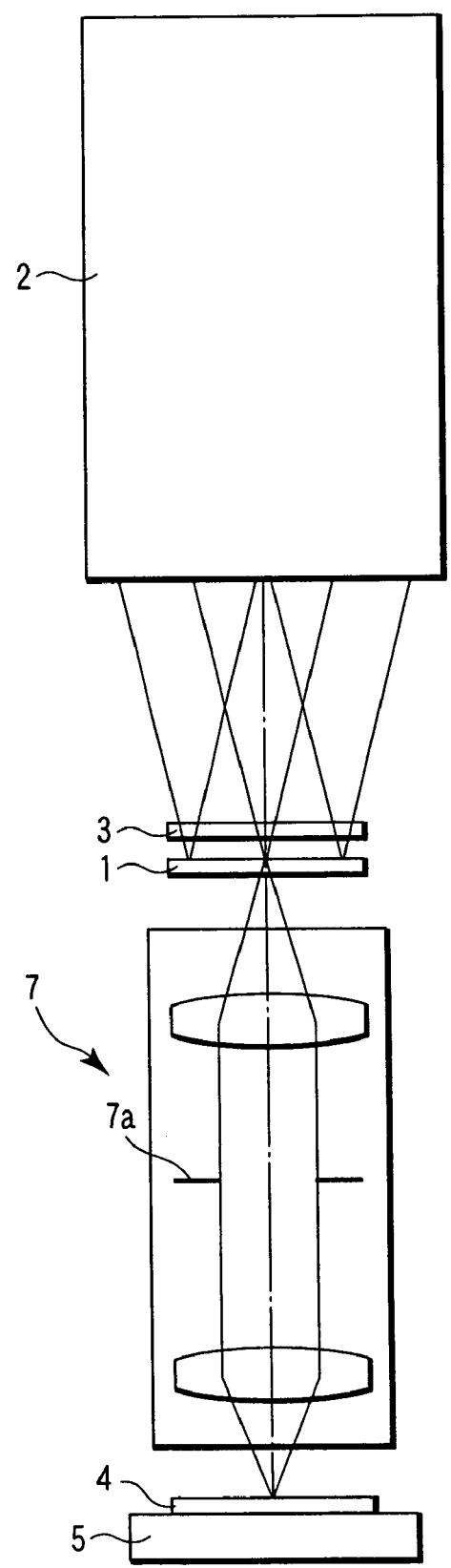
FIG. 9 is a diagram schematically showing the crystallization apparatus according to a third embodiment of the present invention.

FIG. 9 is a diagram schematically showing the constitution of the crystallization apparatus according to a third embodiment of the present invention. The third embodiment includes a constitution similar to that of the second embodiment, but is different from the second embodiment in that the phase shift mask 1 and substrate 4 are disposed so as to have an optically conjugated relation via an optical image forming system 7. The different respect from the second embodiment will be noticed, and the third embodiment will be described hereinafter. It is to be noted that in FIG. 9, for the clarification of the figure, the inner constitution of the illumination optical system 2 is omitted.

The optical image forming system 7 according to the third embodiment includes an aperture diaphragm 7a is disposed in a pupil plane of the optical image forming system 7. The aperture diaphragm 7a is any one of a plurality of aperture diaphragms whose apertures (light transmission portions) have different sizes, and the plurality of aperture diaphragms can be converted with respect to the light path. Alternatively, the aperture diaphragm 7a may also include an iris diaphragm having an aperture of which size can be continuously changed. The size of the aperture of the aperture diaphragm 7a (i.e., the image-side numerical aperture of the optical image forming system 7) is set so as to generate the periodical light intensity distribution of the two-steps inverse peak type on the semiconductor film of the substrate 4. The width of the intensity distribution of the two-steps inverse peak type is preferably set to be equal to the pixel pitch of the liquid crystal display.

The width of the light inverse peak portion formed on the semiconductor film of the substrate 4 by the function of the phase shift mask 1 is of the same degree as that of a resolution R of the optical image forming system 7. Assuming that the wavelength of the light beam for use is $\lambda$, and the image-side numerical aperture of the optical image forming system 7 is NA, the resolution R of the optical image forming system 7 is defined by $R=k\lambda/NA$. A constant k has a value substantially close to 1 depending on specification of the illumination optical system 2 which illuminates the phase shift mask 1, degree of coherence of the light beam supplied from the light source, and definition of the resolution. In this manner, when the image-side numerical aperture NA of the optical image forming system 7 is reduced, so that the resolution of the optical image forming system 7 is lowered in the third embodiment, the width of the inverse peak type increases.

In the third embodiment, in the same manner as in the first and second embodiments, the semiconductor film of the substrate 4 is irradiated with the light beam which has the periodical light intensity distribution of the two-steps inverse peak type by both the functions of the convergence/divergence element 3 and phase shift mask 1. Therefore, the lateral growth reaches the peak without stopping halfway from the crystal nucleus, and the crystallized semiconductor film having the large grain size can be generated. Also in the third embodiment, in the same manner as in the second embodiment, the satisfactory crystallization can be realized without being influenced by the abrasion in the substrate 4. Moreover, it is easy to adjust the positional relation between the substrate 4 and optical image forming system 7.

Figure 10A:
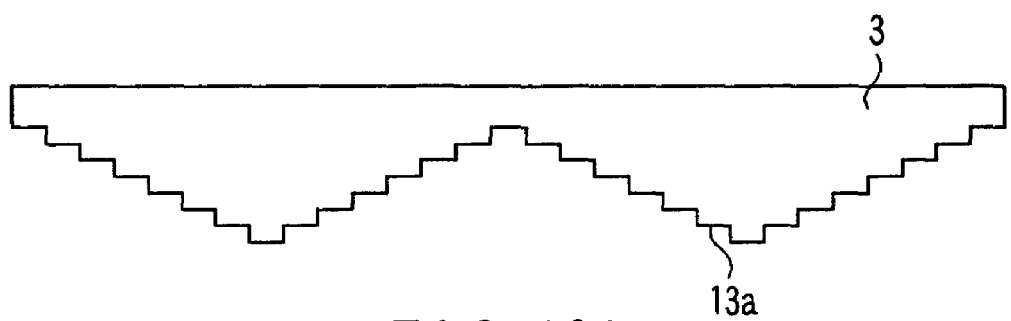
FIG. 10A is a diagram showing the convergence/divergence element whose refractive surface is formed in a stepped shape.

In the above-described embodiments, the convergence/divergence element 3 has the refractive surface 13a entirely having the sinusoidal wave shape, but may also include a refractive surface having another continuous curved surface shape, or a refractive surface having a stepped shape as shown in FIG. 10A.

Figure 10B:
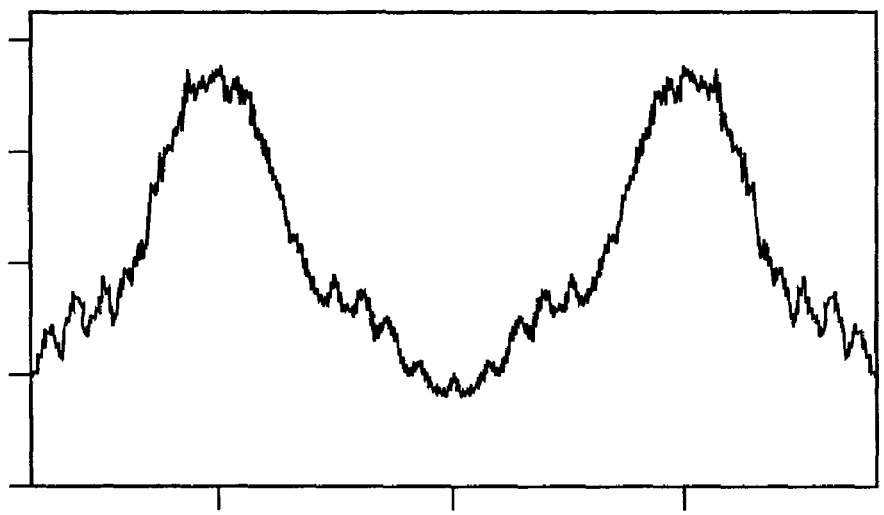
FIG. 10B is a diagram showing a simulation result concerning the intensity distribution of the light on the phase shift mask with the use of the convergence/ divergence element shown in FIG. 10A.

FIG. 10B is a diagram showing a simulation result concerning the concave intensity distribution on the light beam with which the phase shift mask is irradiated, when the refractive surface of the convergence/divergence element 3 is formed in the stepped shape. In the simulation, the substantially sinusoidal wave shaped refractive surface 13a of the convergence/divergence element 3 is approximated by steps of eight levels corresponding to 22.5 to 180 degrees including each phase difference of 22.5 degrees. The numerical aperture of the illumination optical system 2 is set to 0.025, and the intensity distribution on the phase shift mask 1 disposed at an interval of 40 $\mu$m from the convergence/divergence element 3 is obtained by calculation. As shown in FIG. 10A, even when the sinusoidal wave shaped refractive surface 13a of the convergence/divergence element 3 is approximated by multiple steps in the substantially sinusoidal wave shape, the light beam transmitted through the convergence/divergence element 3 periodically includes the upward concave intensity distribution. In the distribution, the light intensity is lowest in a line corresponding to the phase shift portion 11e, and increases as distant from the minimum light intensity line.

It is to be noted that the constitution is not limited to the continuous curved surface or the multiple-step approximation, and the convergence/divergence element 3 may also be constituted as "quino form" folded back in a range of phase differences of 0 to $2\pi$. The convergence/divergence function by the refractive index distribution of an optical material can also be applied without giving the refractive surface to the convergence/divergence element 3. For example, it is possible to use related arts such as photo polymer whose refractive index is modulated by the light intensity, and ion exchange of glass. A hologram or diffractive optical element may also be used to apply an optical conversion function equivalent to the convergence/divergence element 3.

Moreover, in the above-described embodiments, the refractive surface 13a of the convergence/divergence element 3 is formed to have a one-dimensional refraction function along the x-direction, but the present invention is not limited to this, and the convergence/divergence element 3 may also have a two-dimensional refraction function along the x-direction and y-direction. In this case, the upward concave intensity distribution formed on the phase shift mask 1 by the function of the convergence/divergence element 3 periodically has a similar upward concave profile both in the x-z and y-z planes.

Figure 11:
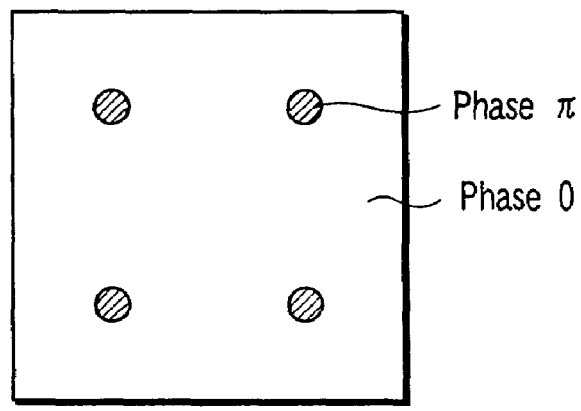
FIG. 11 is a top plan view showing a modification example of the phase shift mask.

Furthermore, in the above-described embodiments, the phase shift mask 1 is constituted of at least one unit having four rectangular regions corresponding to phases of 0, $\pi/2$, $\pi$, $3\pi/2$, but the present invention is not limited to this, and the phase shift mask 1 can variously be modified. For example, a phase shift mask may also be used which includes an intersection (phase shift portion) including three or more phase shift lines and in which the integral value of the complex transmittance of the circular region centering on the intersection is substantially zero. As shown in FIG. 11, a phase shift mask may also be used which has a circular step corresponding to the phase shift portion and which is set so as to have a phase difference of $\pi$ between the light beam transmitted through the circular stepped portion and the light beam transmitted through the periphery.

The intensity distribution can also be calculated in a state of design, but it is preferable to observe and confirm the intensity distribution in an actual surface to be treated (surface to be exposed). This observation is performed by enlarging the surface to be treated by the optical system and by input with image pickup elements such as a CCD. When the light beam for use is ultraviolet, the optical system is restricted, and therefore a fluorescent plate may be disposed in the surface to be treated to convert the beam to a visible light.

Moreover, in the above-described embodiments, the convergence/divergence element 3 which is the optical conversion element and the phase shift mask 1 may be formed as individual optical members, but the present invention is not limited to this, and the convergence/divergence element 3 and phase shift mask 1 may also integrally be formed. The convergence/divergence element 3 and phase shift mask 1 do not have to be positioned, respectively, when attached to the apparatus, and the convergence/divergence element 3 and phase shift mask 1 can be attached as one integrated optical member to the apparatus with good accuracy.

The integral assembly forming convergence/divergence element 3 and phase shift mask 1 preferably includes an incident plane on which the light beam is incident upon the convergence/divergence element 3, a boundary plane between the convergence/divergence element 3 and a phase shift portion constituting the phase shift mask 1 in order from an incidence direction of the light beam. In this manner, a constitution which does not include a layer structure of glass is disposed on the side of the substrate 4 rather than the phase shift portion. Accordingly, in each embodiment, the distance between the phase shift surface and the substrate 4 is sufficiently reduced, and satisfactory crystallization can be performed.

Particularly, in the second and third embodiments which require high resolution for exactly forming the intensity distribution of the inverse peak type, with the constitution which does not include the layer structure of glass on the side of the substrate 4 rather than the phase shift portion, generation of unnecessary aberration can be avoided.

Figure 12:
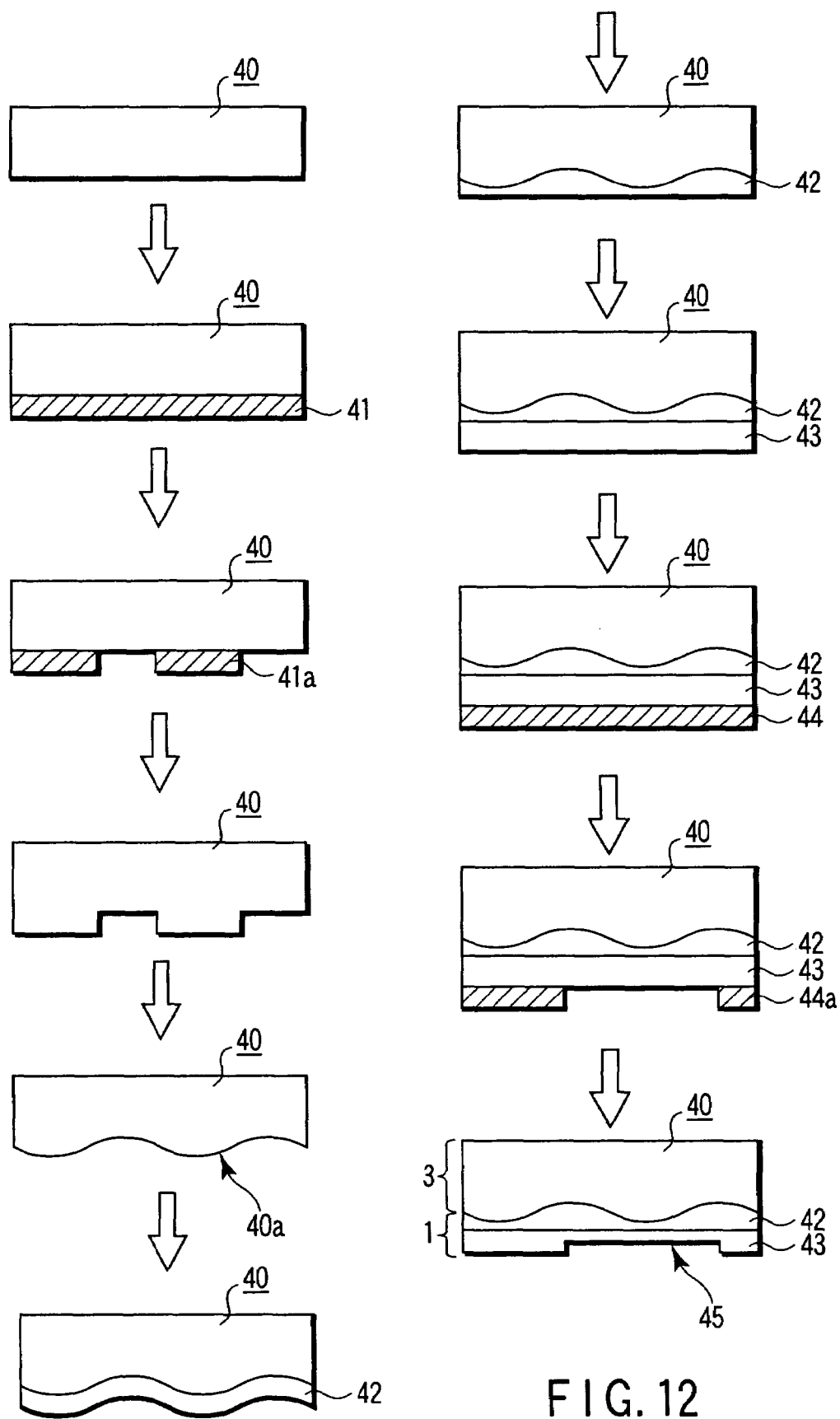
FIG. 12 is a diagram showing a step of integrally forming the convergence/divergence element and phase shift mask.

FIG. 12 is a diagram for illustrating a method of integrally forming the convergence/divergence element 3 and phase shift mask 1. Referring to FIG. 12, for example, when a quartz substrate 40 having a refractive index of 1.50841 is coated with a resist 41, and electron beam drawing and developing are performed to obtain a resist pattern 41*a*. Next, the resist pattern 41*a* is used as a mask to perform dry etching of parts of the substrate 40, further the resist is removed, and accordingly the surface of the quartz substrate 40 is etched/processed. Moreover, when the steps each of the resist application to the resist removal are repeated, a refractive surface 40*a* (e.g., a depth of 0.124 $\mu$m) entirely having a substantially sinusoidal wave shape is formed in the surface of the quartz substrate 40.

Subsequently, a high refractive index material film 42 having a thickness of 3 $\mu$m formed of $Si_xN_y$ (high refractive index material), and, for example, having a refractive index of about 2.3 on the sinusoidal wave shaped refractive surface 40*a* of the quartz substrate 40 by a CVD process. Moreover, for example, by a chemical mechanical polishing (CMP) technique, the surface of the high refractive index material film 42 is flatted. Next, an organic spin on glass (SOG) film (e.g., alkoxysilane replaced with an alkyl group) 43, for example, having a thickness of 40 $\mu$m is formed on the flatted surface of the high refractive index material film 42.

Furthermore, the surface of the organic SOG film 43 is coated with a resist 44, the electron beam drawing and developing are performed, and accordingly a resist pattern 44*a* is obtained. Subsequently, the resist pattern 44*a* is used as a mask to perform the dry etching, further the resist is removed, and accordingly a phase shift surface 45, for example, having a depth of 0.248 $\mu$m is formed. In this manner, the quartz substrate 40 constituting the convergence/divergence element 3 is formed integrally with the high refractive index material film 42 and organic SOG film 43 which constitute the phase shift mask 1. The refractive surface 40*a* having the sinusoidal wave shape constitutes an interface between a convergence refractive surface and the phase shift mask 1.

Figure 13A:
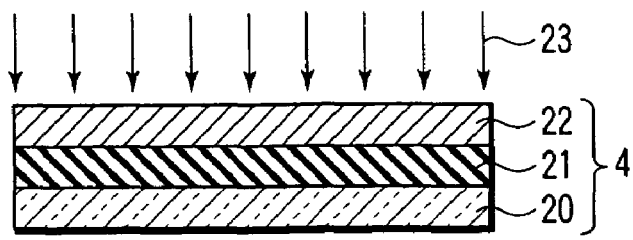
FIGS. 13A to 13E show steps of using the crystallization apparatus of each embodiment to manufacture an electronic device.

FIGS. 13A to 13E show steps of using the crystallization apparatus of each embodiment to manufacture an electronic device. As shown in FIG. 13A, a chemical vapor phase growth process or sputter process is used to form an underlayer film 21 (e.g., a stacked film of SiN having a film thickness of 50 nm and $SiO_2$ having a film thickness of 100 nm) and an amorphous semiconductor film 22 (e.g., Si, Ge, SiGe, and the like having a film thickness of about 50 nm to 200 nm) on an insulating substrate 20 (e.g., alkali glass, quartz glass, plastic, polyimide, and the like). Accordingly, the substrate 4 is prepared.

Figure 13B:
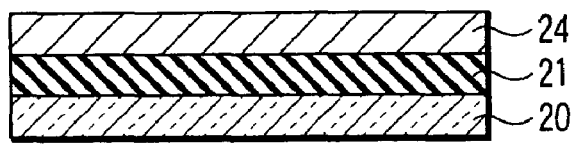

The crystallization apparatus is used to irradiate a part or whole of the surface of the formed amorphous semiconductor film 22 with light beams 23 (e.g., KrF excimer laser beams or XeCl excimer laser beams). For the crystallization apparatus according to each embodiment of the present invention, the surface is irradiated with the light beams which have the intensity distribution of the two-steps inverse peak type. Therefore, as shown in FIG. 13B, a polycrystalline semiconductor film or single crystalline semiconductor film 24 can be formed which has crystals having large grain sizes as compared with the polycrystalline semiconductor film generated using the related-art crystallization apparatus.

When the amorphous semiconductor film 22 has a relatively broad surface, and only a part of the surface is irradiated with one irradiation by the crystallization apparatus, the crystallization of the whole surface of the amorphous semiconductor film 22 is performed by relatively moving the crystallization apparatus and the amorphous semiconductor film 22 with respect to each other in two directions crossing at right angles to each other.

For example, the amorphous semiconductor film 22 is held, the crystallization apparatus scans the surface of the amorphous semiconductor film 22 in two directions crossing at right angles to each other, and the surface of the amorphous semiconductor film 22 is continuously irradiated and crystallized. Alternatively, the amorphous semiconductor film 22 is laid on a stage which can move in two directions crossing at right angles to each other, the stage is moved with respect to the fixed crystallization apparatus, and the surface of the amorphous semiconductor film may accordingly be irradiated with the light beam. Alternatively, with respect to the crystallization apparatus supported by an arm movable only in one direction, the amorphous semiconductor film 22 is moved in the direction crossing at right angles to the apparatus. In this system, the crystallization apparatus and amorphous semiconductor film 22 may be moved with respect to each other in two directions crossing at right angles to each other to irradiate the surface of the amorphous semiconductor film 22 with the light beam.

Figure 13C:
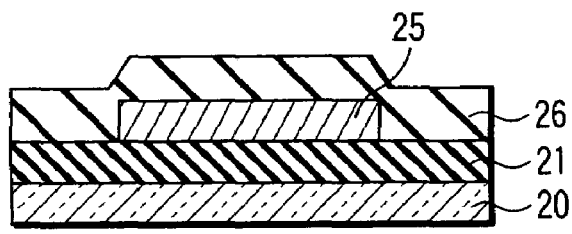
Figure 13D:
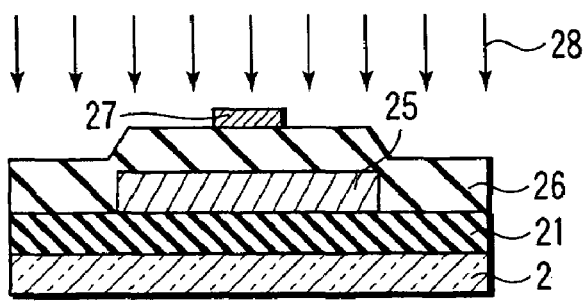

Next, as shown in FIG. 13C, a photolithography technique is used to process the polycrystalline semiconductor film or the single crystalline semiconductor film 24 into a semiconductor film 25 having an insular shape, and the chemical vapor phase growth process or sputter process is used to form an $SiO_2$ film having a film thickness of 20 nm to 100 nm as a gate insulating film 26. Furthermore, as shown in FIG. 13D, a gate electrode 27 (e.g., silicide, MoW, and the like) is formed, and the gate electrode 27 is used as a mask to implant impurity ions 28 (phosphor for an N-channel transistor, boron for a P-channel transistor). Thereafter, anneal treatment (e.g., at 450° C. for one hour) is performed in a nitrogen atmosphere to activate the impurities.

Figure 13E:
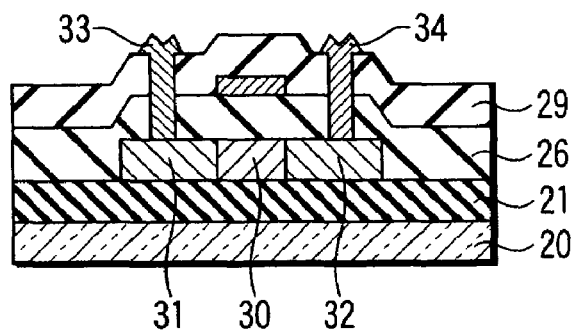

Next, as shown in FIG. 13E, an interlayer insulating film 29 is formed, contact holes are made, and a source electrode 33 and drain electrode 34 connected to a source 31 and drain 32 formed in the semiconductor film 25, via a channel 30 are formed. The channel 30 has been formed in accordance with the position of the large grain size crystal of the polycrystalline semiconductor film or the single crystalline semiconductor film 25 generated in the steps shown in FIGS. 13A and 13B.

By the above-described steps, a polycrystalline transistor or single crystalline semiconductor transistor can be formed. The polycrystalline transistor or single crystalline transistor manufactured in this manner can be applied to a driving circuit of a liquid crystal display or electro-luminescence (EL) display, or an integrated circuit of a memory (SRAM or DRAM) or CPU.

As described above, according to the present invention, an intensity distribution of a two-steps inverse peak type is formed on a semiconductor film of a substrate by both functions of a convergence/divergence element and phase shift mask, therefore lateral growth reaches a peak from a crystal nucleus without stopping halfway, and a crystallized semiconductor film having a large grain size can be formed.

What is claimed is:

1. A crystallization apparatus comprising: an illumination optical system to emit a light beam having a homogeneous intensity distribution to a non-crystallized semiconductor film, so that the non-crystallized semiconductor film is irradiated with the light beam to crystallize the non-crystallized semiconductor film, the crystallization apparatus further comprising:

an optical conversion element which converts the light beam having the homogeneous intensity distribution to a light beam having a periodical upward concave intensity distribution; and a phase shift mask which passes the light beam, gives a phase difference between parts of the light beam, and converts the light beam having the homogeneous intensity distribution into a light beam having a periodical intensity distribution of an inverse peak type, the phase shift mask having a phase shift portion to determine a position where the intensity distribution of the inverse peak type is minimized, the optical conversion element being positioned on a light path between the illumination optical system and non-crystallized semiconductor film, the phase shift mask being positioned on the light path between the optical conversion element and non-crystallized semiconductor film, and the optical conversion element and phase shift mask being positioned so that a minimum position of the upward concave intensity distribution is disposed opposite to the phase shift portion, and the light beam which is converted by the optical conversion element and phase shift mask and with which the non-crystallized semiconductor film is irradiated having the intensity distribution including an inverse peak portion inside an upward concave portion.

2. The crystallization apparatus according to claim 1, wherein the phase shift mask and non-crystallized semiconductor film are disposed substantially in parallel with and in the vicinity of each other.

3. The crystallization apparatus according to claim 1, further comprising:

an optical image forming system positioned on the light path between the phase shift mask and non-crystallized semiconductor film, wherein the non-crystallized semiconductor film is distant from a plane optically conjugated with the phase shift mask along an optical axis by a predetermined distance.

4. The crystallization apparatus according to claim 1, further comprising:

an optical image forming system positioned on the light path between the phase shift mask and non-crystallized semiconductor film, the optical image forming system having an image-side numerical aperture which is set so as to convert the light beam from the phase shift mask to the light beam which has the periodical intensity distribution of the inverse peak type.

5. The crystallization apparatus according to any one of claim 1, wherein the optical conversion element has a convergence/divergence element including a divergence region in which the light beam from the illumination optical system diverges and a convergence region in which the light beam from the illumination optical system converges to lower a light intensity of the phase shift portion by a divergence function and convergence function.

6. The crystallization apparatus according to claim 5, wherein the divergence region includes a divergence refractive surface on which the light beam diverges by a refraction function, and the convergence region includes a convergence refractive surface on which the light beam converges by the refraction function.

7. The crystallization apparatus according to claim 6, wherein the divergence refractive surface and convergence refractive surface have a one-dimensional refraction function along one direction.

8. The crystallization apparatus according to claim 6, wherein the divergence refractive surface and convergence refractive surface have a two-dimensional refraction function along two directions crossing at right angles to each other.

9. The crystallization apparatus according to claim 6, wherein the divergence refractive surface and convergence refractive surface form a refractive surface which has a sinusoidal wave shape.

10. The crystallization apparatus according to claim 9, wherein the refractive surface is formed in a continuous curved surface shape.

11. The crystallization apparatus according to claim 9, wherein the refractive surface is formed in a step shape.

12. The crystallization apparatus according to claim 1, wherein the intensity distribution of the light beam with which the non-crystallized semiconductor film is irradiated has an inflection point between the inverse peak portion and upward concave profile.

13. The crystallization apparatus according to claim 1, wherein the convergence/divergence element and phase shift mask are integrally formed to form an integral assembly.

14. The crystallization apparatus according to claim 13, wherein the integral assembly includes a phase shift portion in a boundary surface between the convergence/divergence element and phase shift mask.

15. A crystallization apparatus comprising:

a light source which emits light beam of a light intensity to melt a semiconductor layer to be treated;

a wavefront dividing element upon which the light beam from the light source is incident;

a phase shift mask upon which the light beam from the wavefront dividing element is incident and which emits a light beam having a light intensity pattern; and a stage which supports a substrate having the semiconductor layer to be treated upon which the light beam from the phase shift mask is incident.

16. A crystallization apparatus comprising:

a light source which emits a light beam of a light intensity to melt a semiconductor layer to be treated;

an optical conversion element which subjects the light beam from the light source to a convergence function and divergence function and which allows the light beam to have a light intensity distribution having a rise/fall of the light intensity; and an optical system which receives the light beam from the optical conversion element and which allows the light beam to have a light intensity distribution of a two-steps inverse peak type having the light intensity distribution of the inverse peak type superimposed upon the light intensity distribution having the rise/fall of the light intensity.

* * * * *